United States Patent
Stappaerts

[19]

[11] Patent Number: 6,118,560
[45] Date of Patent: *Sep. 12, 2000

[54] SCATTER NOISE REDUCTION IN HOLOGRAPHIC STORAGE SYSTEMS BY SIGNAL-NOISE ORTHOGONALIZATION

[75] Inventor: Eddy Alfons Stappaerts, San Ramon, Calif.

[73] Assignee: Northrop Grumman Corporation, Los Angeles, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/020,077

[22] Filed: Feb. 6, 1998

[51] Int. Cl.$^7$ .............................. G03H 1/26; G03H 1/28; G03H 1/02
[52] U.S. Cl. .................................. 359/24; 359/7; 359/22
[58] Field of Search ...................... 359/3, 4, 7, 35, 359/22, 24; 365/124, 125, 216

[56] References Cited

U.S. PATENT DOCUMENTS

| | | | |
|---|---|---|---|
| Re. 30,166 | 12/1979 | Lee ............................................. | 365/122 |
| 3,650,595 | 3/1972 | Gerritsen et al. ........................ | 350/3.5 |
| 3,720,453 | 3/1973 | Lee et al. ................................. | 350/3.5 |
| 3,756,684 | 9/1973 | Fox ........................................... | 350/3.5 |
| 3,785,712 | 1/1974 | Hannan .................................... | 350/3.5 |
| 3,834,787 | 9/1974 | Oshida ...................................... | 359/22 |
| 3,867,009 | 2/1975 | Pawluczyk ............................... | 350/3.5 |
| 3,871,740 | 3/1975 | Matsubara et al. ....................... | 350/3.5 |
| 3,917,380 | 11/1975 | Kato et al. ............................... | 350/3.5 |
| 4,013,338 | 3/1977 | Sato et al. ................................ | 350/3.5 |
| 4,478,490 | 10/1984 | Wreede et al. ......................... | 350/162.11 |
| 4,768,881 | 9/1988 | Juptner et al. .......................... | 356/347 |
| 4,945,528 | 7/1990 | Crasemann ............................. | 369/59 |
| 4,984,856 | 1/1991 | Moss et al. ............................. | 350/3.67 |
| 5,016,953 | 5/1991 | Moss et al. ............................. | 350/3.66 |
| 5,105,287 | 4/1992 | Moss et al. ............................. | 359/3 |
| 5,223,355 | 6/1993 | Hampp et al. ......................... | 430/1 |
| 5,299,035 | 3/1994 | Leith et al. ............................. | 359/9 |
| 5,337,170 | 8/1994 | Khoury et al. ......................... | 359/7 |
| 5,363,363 | 11/1994 | Gage ....................................... | 369/116 |
| 5,491,682 | 2/1996 | Dohmeier et al. ..................... | 369/124 |

*Primary Examiner*—Cassandra Spyrou
*Assistant Examiner*—Jared Treas
*Attorney, Agent, or Firm*—Terry J. Anderson; Karl J. Hoch, Jr.

[57] ABSTRACT

A method and an apparatus for increasing detection signal-to-noise ratio, by reducing the effect of optical scatterers from a holographic storage medium, are disclosed. The method comprises the step of sensing the phase of scattered radiation and the subsequent step of writing the hologram data into the holographic storage medium. The image containing the hologram data is written with phase characteristics such that, during a subsequent hologram readout, the electric fields from the image and scatterers are 90 degrees out of phase. This optimum phase relationship greatly reduces the effect of scatter noise, thereby increasing signal-to-noise ratio and reducing bit-error-rate.

21 Claims, 3 Drawing Sheets

SCATTER NOISE REDUCTION IN HOLOGRAPHIC STORAGE SYSTEMS BY SIGNAL-NOISE ORTHOGONALIZATION

FIELD OF THE INVENTION

The present invention relates generally to methods and apparatuses for improving the performance of holographic storage systems, and more particularly to a method and an apparatus for reducing the effect of detection noise due to optical scattering in a holographic storage medium.

BACKGROUND OF THE INVENTION

It is well known that holography can be used to store massive digital data in a small storage volume, such as a photo-refractive crystal, for a later readout.

A number of configurations exist for holographic storage systems, particularly with respect to the multiplexing techniques used for maximizing storage density. A commonly used configuration is shown in FIG. 1. The primary components of this system are an input device, a holographic storage medium such as a photo-refractive crystal, and an output device. The input device, usually implemented by a spatial light modulator (SLM), consists of an array of amplitude modulators. The output device is a detector array such as a charge-coupled-device (CCD) which receives the output radiation from the storage medium during a hologram readout.

During a hologram-write operation, data are inputted into the SLM in the form of amplitude modulations of the pixels of the SLM. A laser beam illuminates the SLM, and the resulting object beam emanating from the SLM pixels interferes with a write reference beam in the storage medium to create a large number of gratings, one for each SLM pixel. During a hologram-readout operation, a read reference beam illuminates the storage medium, resulting in reflected radiation from each of the stored gratings. The radiation from each grating is detected by a CCD pixel. As an example, for a SLM and a CCD with 1024 by 1024 pixels each, a single hologram (page) stores 1024×1024=1 Mbit of binary data per page. If more than two gray levels are used, the data per page increases by the number of bits. Thus, for 16 gray levels (4 bits), the storage density increases by a factor of four, to 4 Mbits per page in the above example.

Noise sources in holographic storage systems have a number of physical origins. The primary sources are (1) light scattered from the storage medium, (2) light scattered from optical components, (3) intra-page pixel crosstalk, (4) inter-page crosstalk and (5) detector noise. Intra-page and inter-page crosstalk can be reduced by conventional design techniques, at the cost of some decrease in storage density. Light scattered from optical components can also be minimized using conventional techniques. However, it is more difficult to reduce the effect of light scattered from the storage medium, called scatter noise, which severely affects the detection signal-to-noise ratio (SNR), a critical parameter directly linked to the performance of holographic storage systems.

When the holographic storage medium is illuminated by the read reference beam, the detectors receive electric fields from both the stored data and from optical scatterers. Scattering from optical components, external to the holographic storage medium, can be minimized using conventional techniques such as anti-reflection coatings. However, scattering from the storage medium itself represents a much more difficult problem since it originates within the same physical volume as the data and since its spectral characteristics are identical to those of the data electric field.

Furthermore, in some storage media such as iron-doped $LiNbO_3$, scatter noise has been observed to increase with increasing iron doping level. A higher iron concentration is desirable because it improves other system parameters such as hologram erasure time. Thus, reduction of scatter noise will allow other system parameters to be optimized. The invention decouples the effect of scatter noise from such other design considerations, thereby enabling improved overall system performance.

The present invention discloses a method and an apparatus for writing data information into the holographic storage medium such that the detected scatter noise component of the electric field emerging from the holographic storage medium is substantially reduced. Specifically, the invention reduces scatter noise which has the characteristics of laser speckle. The scatter noise intensity is a random complex variable with finite mean. The voltage recorded by each pixel of the CCD array during a hologram readout, due to incident data signal and noise electric fields, can be written in complex variable notation as:

$$V \sim |E_d + E_n e^{i\phi}|^2 \qquad (1)$$

or $$V \sim E_d^2 + 2 E_d E_n \cos(\phi) + E_n^2 \qquad (2)$$

where $E_d$ and $E_n$ are the magnitudes of the data and scatter noise electric fields, respectively, and $\phi$ is their relative phase shift. The proportionality constant between the detected voltage V and the right hand side of Equation (2) depends on detector characteristics and other system parameters, and can be measured or calculated. If the scatter noise is due to a large number of stationary sites in the holographic storage medium, then it has the characteristics of laser speckle. In that case the scatter noise intensity, $I_n$, which is equal to $E_n^2$, is a random variable with an exponential probability distribution and the phase, $\phi$, is uniformly distributed in the interval $[-\pi,\pi]$. The probability density function of the scatter noise intensity $I_n$ is:

$$p(I_n) = \frac{1}{\langle I_n \rangle} e^{-\frac{I_n}{\langle I_n \rangle}} \qquad (3)$$

where $\langle I_n \rangle$ denotes the average value of $I_n$. Although the present invention is described for the case where the scatter noise electric field has the characteristics of speckle, it has general applicability, regardless of the statistics of the scatter field.

The present invention makes use of the fact that, even though the speckle intensity and phase are random variables, the speckle pattern is repeatable from read pulse to read pulse if the interaction geometry and laser beam parameters remain the same.

According to Equation (2), the scatter noise has two contributions, represented by the second and third terms on the right hand side of Equation (2). In a practical system, $E_n$ is much smaller than $E_d$, and the second term dominates the expression for scatter noise. As an example, for $E_n^2/E_d^2 = 10^{-2}$, $V \sim 1 + 0.2 * \cos(\phi) + 0.01$. For $\phi$ near 0 or $\pi$, the maximum noise voltage is 0.01 without the second term, and approximately ±0.2 with the second term included. The corresponding voltage SNR is 100 in the first case and only 5 in the second case.

The present invention discloses a method and an apparatus for eliminating or greatly decreasing the second term by forcing the value of the phase $\phi$ in Equation (2) to be 90 degrees, thereby increasing the detection signal-to-noise ratio.

SUMMARY OF THE INVENTION

A hologram-write method and an apparatus for mitigating detection scatter noise in holographic storage systems by determining orientations of scatter noise vectors before writing hologram data into a holographic storage medium are disclosed. The method comprises the steps of: (a) outputting a first input test image, from a data input device having an array of pixels, into the holographic storage medium; (b) storing the first input test image in the holographic storage medium as a set of first gratings, each of the first gratings corresponding to a pixel in the data input device; (c) reading out the stored first input test image from the holographic storage medium, as a first output test image; (d) recording the first output test image; (e) outputting a second input test image, from the data input device, into the holographic storage medium; (f) storing the second input test image in the holographic storage medium as a set of second gratings, each of the second gratings corresponding to a pixel in the data input device; (g) reading out the stored second input test image from the holographic storage medium, as a second output test image; (h) recording the second output test image; (i) determining orientation of a scatter noise vector at each of the first gratings in the holographic storage medium, from recorded values of the first and second output test images; (j) outputting final hologram data, from the data input device, into the holographic storage medium; and (k) storing the final hologram data in the holographic storage medium as a set of final gratings such that, at each of the final gratings, the data vector is orthogonal to the scatter noise vector, resulting in reducing detection scatter noise at a subsequent hologram readout.

Each of the first and second input test images is stored with a weak strength level while the final hologram data are stored with a full strength level. The strength level of an input image determines the intensity level of the corresponding output image.

In the preferred embodiment of the invention, in the holographic storage medium, each of the second gratings is located from a corresponding first grating at a distance equal to a quarter of an optical wavelength along the direction of a propagation vector of the corresponding first grating. A propagation vector is also known in the art as a K-vector or a wave number vector. Thus, the set of second gratings is shifted from the set of first gratings by a quarter of an optical wavelength along the direction of the K-vectors of the first gratings. This shift is realized by increasing (or decreasing) the pathlength difference between the second write reference beam and the second object beam, with respect to the pathlength difference between the first write reference beam and the first object beam.

In the preferred embodiment of the invention, the first and second input test images are identical, in order to simplify the computation of orientations of the scatter noise vectors. At each grating of the first input test image in the holographic storage medium, the orientation of a scatter noise vector, indicated by the phase shift between the scatter noise vector and the data vector of the first intput test image, is computed from the recorded values of the first and second output test images.

In an alternate embodiment of the invention, the step of storing the second input test image also comprises the step of erasing the first gratings from the holographic storage medium. These two steps can be carried out simultaneously.

If the two input test images are not erased when the final hologram data are written, then they will result in a small error at a subsequent hologram-read of the stored hologram data. In the preferred embodiment, the step of storing the final hologram data also comprises the step of erasing the stored first and second input test images from the hologram storage medium. These two steps can be carried out simultaneously.

In the alternate embodiment, where the first input test image is erased during the writing of the second input test image, only the second input test image needs to be erased during the hologram-write of the final hologram data.

Thus, the invention provides a method for eliminating or reducing the mixing term in the noise voltage, i.e., the second term of Equation (2). Since the phase, $\phi$, is a random variable, this requires sensing of this phase. In the invention, the phase measurement is carried out before the hologram-write of the desired hologram data, and is part of the whole hologram-write process. It is impractical to measure and store the speckle noise information for each hologram since the amount of data is approximately the same as the memory capacity. Such a scheme would require an infinite series of storage systems.

The measurement of $\phi$ is performed by writing and reading two test holograms of weak strength. In the architecture of FIG. 2, the phase measurement is carried out in parallel for all the input pixels. The weak test holograms can be erased as part of the final data write step. The strength of each of the test holograms must be sufficient such that the effect of detector noise on the phase measurement is negligible.

In the hologram storage medium, the two sets of test hologram gratings, one grating for each pixel, are physically shifted from each other by a quarter of an optical wavelength along the direction of the grating K-vectors. This shift is realized, for each pixel, by increasing or decreasing the pathlength difference between the write reference beam and the object beam. Since the strength of each of the two test holograms is known a priori, the phase angle can be calculated from the measurements of these two test hologram output images. From this information, for each input data pixel, the phase difference between the write reference beam and the object beam, which is required to obtain a phase shift of $\pi/2$ between the scatter noise vector and the data vector during a subsequent hologram-read, is computed. After setting the phase of each input data pixel accordingly, the final hologram is written into the storage medium. Improved performance is obtained if the test hologram gratings are erased during the hologram-write of the final hologram.

The invention requires a phase modulator array to set the pathlength difference between the write reference beam and the object beam for each input data pixel. An architecture similar to that of FIG. 1 but incorporating this capability is shown in FIG. 2. The invention imposes a stability requirement on the optical system, i.e., the differential pathlength between the write reference and object beams must be stable to within a small fraction of a wavelength during the whole hologram-write sequence, i.e., phase sensing and final hologram-write. The invention increases the time required for the whole hologram-write process, but does not impact the time required for a hologram-read operation. Finally, the invention requires that the scatter noise characteristics do not change significantly after a hologram-write.

DETAILED DESCRIPTION OF THE INVENTION

The detailed description set forth below in connection with the appended drawings is intended as a description of the presently preferred embodiments of the invention, and is not intended to represent the only forms in which the present invention may be constructed or utilized. The description sets forth the functions and the sequence of the steps for constructing and operating the invention in connection with the illustrated embodiments. It is to be understood, however, that the same or equivalent functions may be accomplished by different embodiments that are also intended to be encompassed within the spirit and scope of the invention.

Figure 1:
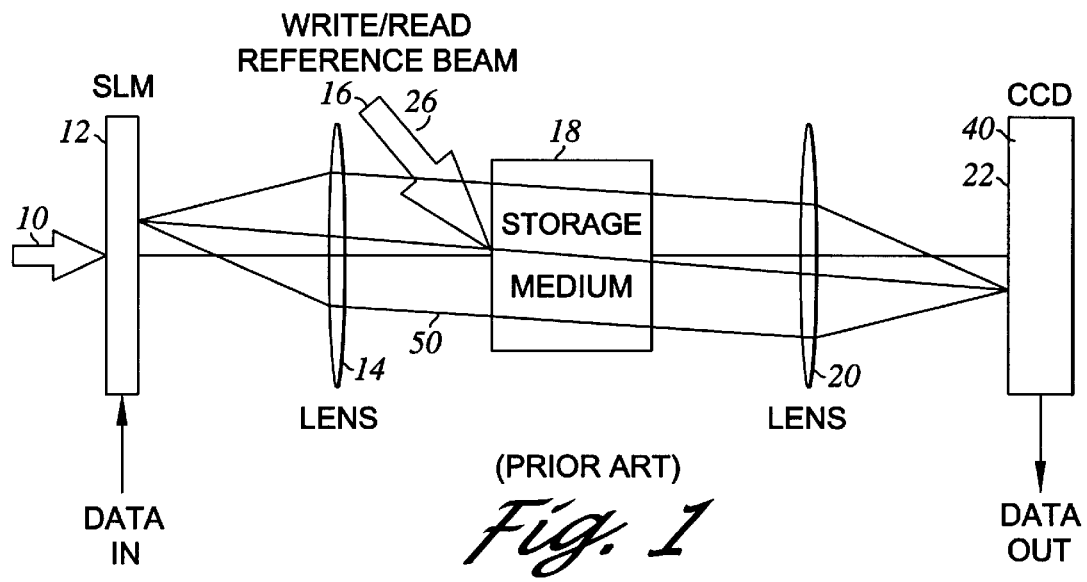
FIG. 1 shows the schematic of a commonly used holographic storage system.

The present invention relates to the commonly used holographic storage architecture depicted in FIG. 1. Typical components of this architecture include a spatial light modulator (SLM) 12, a holographic storage medium 18, and an charged-coupled-device (CCD) detector array 40. During hologram-write operation, data are inputted into the SLM 12 in the form of amplitude modulations of the pixels of the SLM's array. A laser beam 10 illuminates the SLM 12, passes through a collimating lens 14, and interferes with a write reference beam 16 in the storage medium 18 to create a large number of gratings, one for each SLM pixel. During a conventional hologram-read operation, a read reference beam 26, typically co-propagating with the write reference beam 16 as shown in FIG. 1, illuminates the storage medium 18, resulting in reflected radiation from each of the storage gratings. The radiation from each pixel grating passes through a focusing lens 20 and produces an output pattern 22 at the focal plane of the focusing lens. A CCD detector array 40 records the intensity of the output pattern 22. The aforementioned architecture and operations are well established and thus constitute prior art.

The present invention discloses a new method and apparatus for writing the data information into the holographic storage medium 18 such that the scatter noise component of the electric field emerging from holographic storage medium 18 during a subsequent hologram-read operation is reduced. Specifically, the invention reduces the effect of scatter noise which has the characteristics of laser speckle.

Figure 3A:
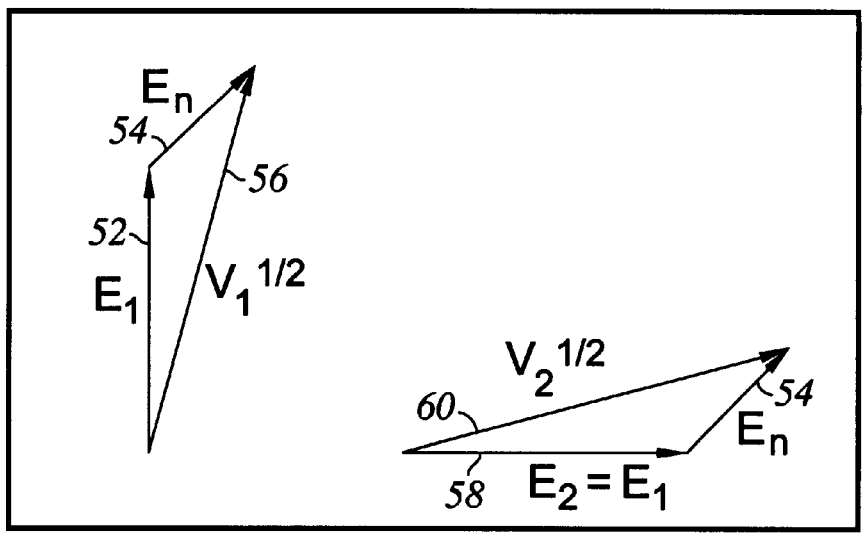
FIGS. 3a and 3b show complex variable phasor diagrams illustrating the hologram-write method of the present invention, where each final hologram data phasor stored in the hologram storage medium is orthogonal to a scatter noise phasor.
Figure 3B:
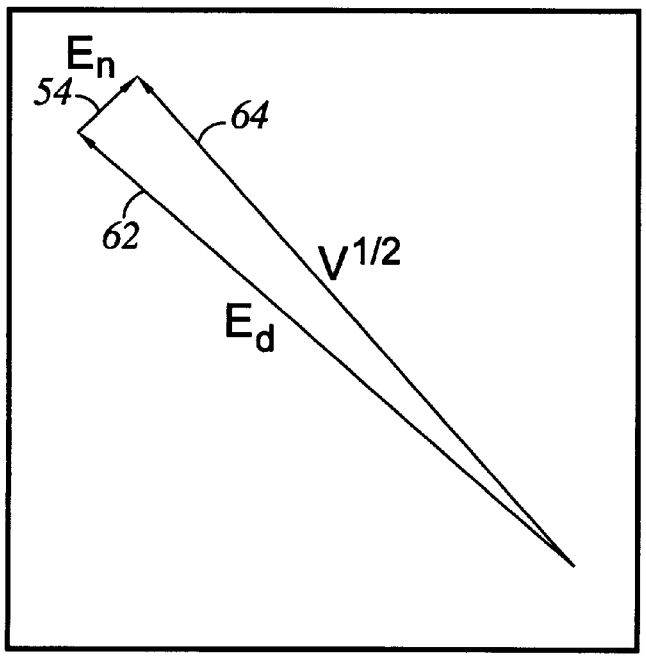

FIGS. 3a and 3b show complex variable phasor diagrams illustrating the phase sensing and data write processes. The phase sensing process consists of four steps, hereafter called steps 1–4, while the data write process consists of one step, hereafter called step 5.

Figure 2:
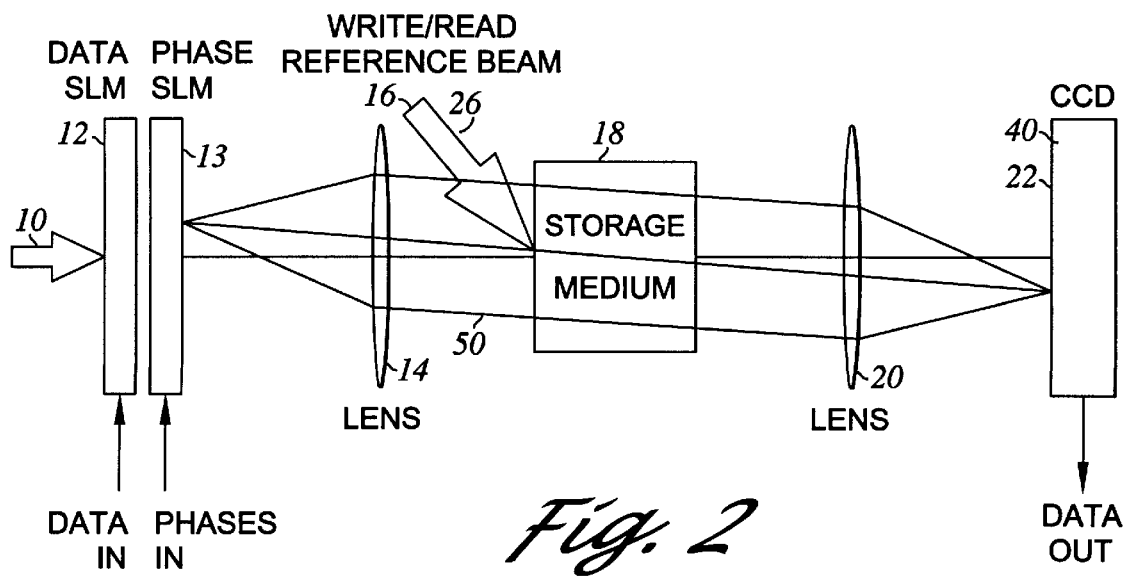
FIG. 2 shows the holographic storage system of the present invention. This system includes an additional spatial light modulator to change the phase of each pixel of the input data.

Referring to FIG. 2, in step 1, a weak first test hologram, also called a probe hologram, of known strength is inputted into the data SLM 12 and is written into the storage medium 18 by interfering the write reference beam 16 with the object beam 50. In step 1, nothing is stored in the phase SLM 13. Hologram strength is defined as the noise-free detector voltage generated at hologram readout. The full hologram strength corresponds to the strength of the data to be stored. The hologram strength determines the intensity level of the detected hologram output image. This first test hologram must be sufficiently strong to overcome detector noise at hologram readout. During this first step, an arbitrary phase difference exists between the write reference beam 16 and the object beam 50. This phase difference depends on the pathlength difference between the two beams 16, 50. The pathlength difference must be much smaller than the laser coherence length.

In step 2, the first test hologram is read in a conventional manner, by illuminating the storage medium 18 with the read reference beam 26, and recording the resulting output pattern 22 with the detector 40, resulting in a detector voltage at each pixel of the detector 40:

$$V_1 \sim |E_1 + E_n e^{i\phi}|^2 \qquad (4)$$

or, equivalently, if $E_n$ is much smaller than $E_1$:

$$V_1 \sim E_1^2 + 2 E_1 E_n \cos(\phi) \qquad (5)$$

where $E_1$ and $E_n$ are the magnitudes of the first test hologram data and scatter noise electric fields, respectively, and $\phi$ is the relative phase shift between these two electric fields. In these equations, $V_1$ is measured from the detector 40, and $E_1$ can be calculated because the first test hologram data are known. The proportionality factor between the intensity, i.e., the right hand side of Equation (7), and the detector output voltage, i.e., the left hand side of Equation (7) can be measured or calculated. The noise electric field, $E_n$, is due to scatter. The $E_n^2$ term has been neglected because the scattered field is assumed to be much weaker than the electric field generated from the first test hologram gratings. If this assumption is not satisfied, the solution of the equations for $\phi$ is more complex but still possible.

FIG. 3a illustrates the corresponding phasor addition of the electric field $E_1$ 52 and $E_n$ 54 resulting in the detected field $V_1^{1/2}$ 56.

In step 3, a weak second test hologram of known strength is inputted into the data SLM 12, and is written into the storage medium 18 by interfering a second write reference beam 16 with a second object beam 50. For this step, a 90 degree phase shift difference between the second write reference beam 16 and second object beam 50 is added to (or subtracted from) the arbitrary phase difference which existed between the first write reference beam 16 and the first object beam 50 in step 1. This additional phase shift difference does not have to be 90 degrees, but is preferably set at this value to simplify the computations. This phase shift is realized by increasing (or decreasing) the pathlength difference between the second write reference beam 16 and the second object beam 50, with respect to the pathlength difference between the first write reference beam and the first object beam. In the holographic storage medium 18, each grating of the second test hologram is located from a corresponding grating of the first test hologram at a distance equal to a quarter of an optical wavelength along the direction of a propagation vector of the corresponding grating. A propagation vector is also known in the art as a K-vector or a wave number vector.

In step 4, this second test hologram is read in a conventional manner, by illuminating the storage medium 18 with the read reference beam 26 and recording the resulting output pattern 22 with the detector 40. Since the first test hologram written during step 1 is not erased prior to step 3, it also provides an output signal during the hologram-read operation of step 4. Thus, in step 4, the detected voltage at each detector 40 pixel is:

$$V_2 \sim |E_1 + E_2 e^{i\pi/2} + E_n e^{i\phi}|^2 \quad (6)$$

where $E_1$ and $E_2$ are the magnitudes of the electric fields of the first and second test hologram data, respectively, $E_n$ is the magnitude of the scatter noise electric field, and $\phi$ is the phase shift between the scatter noise electric field $E_n$ and the first test hologram data electric field $E_n$. As in step 2, the value of $E_2$ can be calculated because the second test hologram data are known. The only unknowns in equations (7) and (8) are therefore $E_n$ and $\phi$. For the simplest case where the test hologram data of steps 1 and 3 are the same, that is, $E_1 = E_2 = E_p$, equation (8) becomes:

$$V_2 \sim 2E_p^2 + 2E_p E_n [\cos(\phi) + \sin(\phi)] \quad (7)$$

and the phase $\phi$ is given by:

$$\tan(\phi) = \frac{V_2 - V_1 - E_p^2}{V_1 - E_p^2} \quad (8)$$

Equation (10) has two solutions for $\phi$ which differ from each other by $\pi$. Either solution can be used since only the orientation of the noise electric field vector $E_n$, and not its sense, is important.

Alternatively, in step 3, the first test hologram can also be erased while the second test hologram is being written. This can be achieved by writing, in step 3, a hologram which represents the difference between the first test hologram and a hologram which is 90 degrees out of phase with the first test hologram of step 1. This alternate hologram contributes the term $E_2 e^{i\pi/2} - E_1$ instead of $E_2 e^{i\pi/2}$ to the expression on the right hand side of Equation (8). In this case, because the first test hologram written in step 1 is erased in step 3, the second hologram produces, in step 4, the following detector voltage at each detector 40 pixel:

$$V_2 \sim |E_2 e^{i\pi/2} + E_n e^{i\phi}|^2 \quad (9)$$

or, equivalently, if $E_n$ is much smaller than $E_2$:

$$V_2 \sim E_2^2 + 2E_2 E_n \sin(\phi) \quad (10)$$

FIG. 3a illustrates the corresponding phasor addition of the electric field $E_2$ 58 and $E_n$ 54 resulting in the detected field $V_2^{1/2}$ 60.

As in step 2, the value of $E_2$ in equation (12) can be calculated because the second test hologram data are known. The only unknowns in equations (7) and (12) are therefore $E_n$ and $\phi$. For the simplest case where the test hologram data of steps 1 and 3 are the same, that is, $E_1 = E_2 = E_p$, the phase $\phi$ is given by:

$$\tan(\phi) = \frac{V_2 - E_p^2}{V_1 - E_p^2} \quad (11)$$

Equation (13) has two solutions for $\phi$ which differ from each other by $\pi$. Either solution can be used since only the orientation of the noise electric field vector $E_n$ 54, and not its sense, is important.

After the phase angle $\phi$ has been determined for each grating corresponding to a pixel of the data SLM 12, the final hologram containing the data to be stored is written in the final step 5, by interfering a third write reference beam 16 with a third object beam 50. As shown in FIG. 3b, at each grating in the hologram storage medium, the phasor $E_d$ 62 corresponding to a pixel of the final hologram data is orthogonal to that of the now known scatter electric field $E_n$ 54. The phasor addition of the electric field $E_d$ 62 and $E_n$ 54 results in the detected field $V^{1/2}$ 64. The phase relationship between $E_d$ 62 and $E_n$ 54 is obtained by setting, before writing the final hologram into the storage medium 18, for each pixel of the data spatial light modulator 12, the phase difference between the third write reference beam 16 and the third object beam 50 to be greater (or smaller) than the phase difference between the first write reference beam and the first object beam in step 1 by $(\pi/2 - \phi)$. In the architecture of FIG. 2, this is done by changing simultaneously the phases of all hologram data pixels in the data SLM 12 using the phase spatial light modulator 13.

Figure 4:
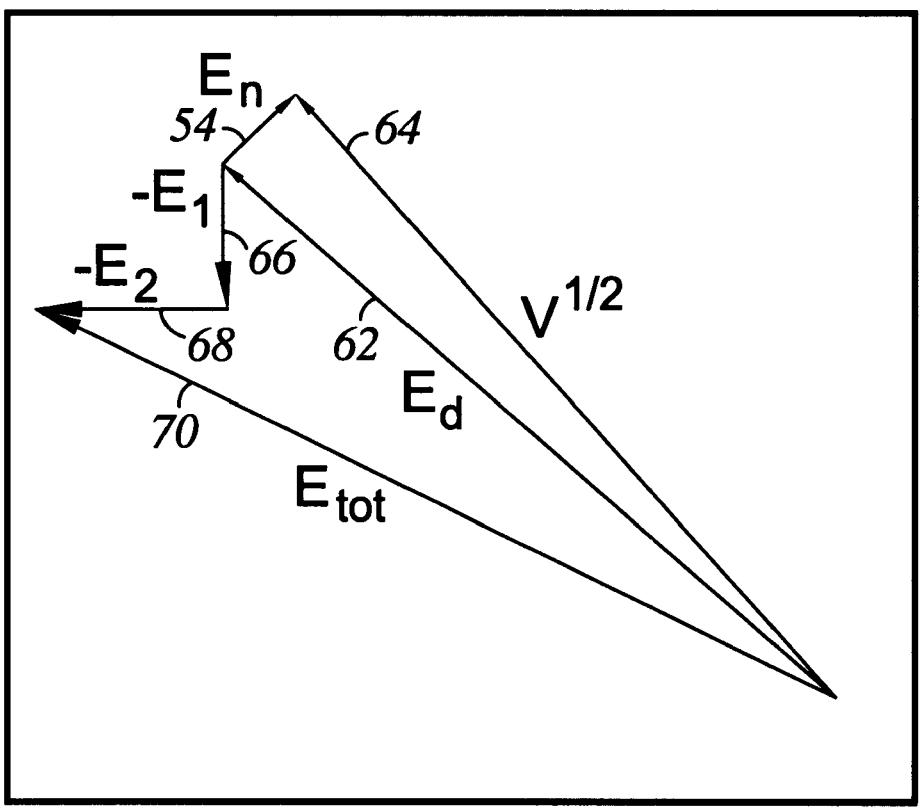
FIG. 4 illustrates an alternate embodiment of the hologram-write method of the present invention, where during the final hologram-write, the two test hologram phasors are subtracted from the hologram data phasor, resulting in erasure of the two test holograms. The remaining hologram data phasor is orthogonal to the scatter noise phasor.

When the stored data are read in a subsequent hologram-read, the output pattern 22 contains the sum of the output signal of the desired hologram data and the output signals of the two test holograms. If the test holograms have sufficiently weak strengths, then their output signals only result in a small error. This error can be eliminated or greatly reduced by storing, in step 5, not the final data hologram but the difference between it and the two test holograms of steps 1 and 3. This is illustrated in FIG. 4. The electric field $E_{tot}$ 70, corresponding to the data written in step 5, is equal to the sum of $E_d$ 62, $-E_1$ 66, and $-E_2$ 68. This in effect erases the first and second test holograms, leaving only the final hologram data $E_d$ 62, orthogonal to the scatter noise $E_n$ 54, in the storage medium 18. The phasor addition of the electric field $E_d$ 62 and $E_n$ 54 results in the detected field $V^{1/2}$ 64.

If, in step 3, the first test hologram was erased during the writing of the second test hologram as described above, then only the second test hologram must be erased in step 5. In that case, the electric field $E_{tot}$ 70, corresponding to the data written in step 5, is equal to the sum of $E_d$ 62 and $-E_2$ 68.

It is understood that the exemplary holographic storage systems described herein and shown in the drawings represent only presently preferred embodiments of the invention. Indeed, various modifications and additions may be made to such embodiments without departing from the spirit and scope of the invention. Those skilled in the art will recognize that various other physical or optical configurations are equivalent and therefore likewise suitable. Thus, these and other modifications and additions may be obvious to those skilled in the art and may be implemented to adapt the present invention for use in a variety of different applications.

What is claimed is:

1. A hologram-write method for mitigating detection scatter noise in holographic storage systems by determining orientations of scatter noise vectors before writing hologram data into a holographic storage medium, the method comprising the steps of:

a) outputting a first input test image, from a data input device having an array of pixels, into the holographic storage medium;

b) storing the first input test image in the holographic storage medium as a set of first gratings, each of the first gratings corresponding to a pixel in the data input device;

c) reading out the stored first input test image from the holographic storage medium as a first output test image, the first output test image being derived from the first input test image and a random scatter noise within the holographic storage medium;

d) recording the first output test image;

e) outputting a second input test image, from the data input device, into the holographic storage medium;

f) storing the second input test image shifted in phase to the first input test image in the holographic storage medium as a set of second gratings, each of the second gratings corresponding to the pixel in the data input device;

g) reading out the stored second input test image from the holographic storage medium as a second output test image, the second output test image being derived from the second input test image and the random scatter noise within the holographic storage medium;

h) recording the second output test image;

i) determining an orientation of a scatter noise vector in the holographic storage medium, from recorded values of the first and the second output test images;

j) outputting final hologram data modulated by the orientation of the scatter noise vector, from the data input device, into the holographic storage medium; and k) storing the final hologram data in the holographic storage medium as a set of final gratings, thereby resulting in reducing detection scatter noise at a subsequent hologram readout.

2. The method as recited in claim 1 wherein the first and second input test images are stored with a first and second strength levels, respectively, and the final hologram data are stored with a final strength level, the first and second strength levels determining intensity levels of the first and second output test images, respectively, the first and second strength levels being much lower than the final strength level.

3. The method as recited in claim 1 wherein step (f) comprises the step of storing each of the second gratings at a distance from a corresponding first grating, the distance being a quarter of an optical wavelength along the direction of a propagation vector of the corresponding first grating.

4. The method as recited in claim 3 wherein the first and second input test images are identical.

5. The method as recited in claim 4 wherein the first input test image comprises an array of first input pixels, the first output test image comprises an array of first output pixels, the second output test image comprises an array of second output pixels, and wherein the orientation of a scatter noise vector at a first grating in the holographic storage medium is computed according to the following formula:

$$\tan(\phi) = \frac{V_2 - V_1 - E_p^2}{V_1 - E_p^2}$$

where $\phi$ is a phase shift datum associated with the scatter noise vector and with a first input pixel corresponding to said first grating, $V_1$ is the associated first output pixel value, $V_2$ is the associated second output pixel value, and $E_p^2$ is an expected detection value of said corresponding first input pixel.

6. The method as recited in claim 1 wherein step (f) comprises the step of:
storing each second grating of the stored second input test image at a distance from a corresponding first grating of the stored first input test image, the distance being a quarter of an optical wavelength along the direction of a propagation vector of the corresponding first grating; and
erasing the first gratings from the holographic storage medium.

7. The method as recited in claim 6 wherein the first and second input test images are identical.

8. The method as recited in claim 7 wherein the first input test image comprises an array of first input pixels, the first output test image comprises an array of first output pixels, the second output test image comprises an array of second output pixels, and wherein the orientation of a scatter noise vector at a first grating in the holographic storage medium is computed according to the following formula:

$$\tan(\phi) = \frac{V_2 - E_p^2}{V_1 - E_p^2}$$

where $\phi$ is a phase shift datum associated with the scatter noise vector and with a first input pixel corresponding to said first grating, $V_1$ is the associated first output pixel value, $V_2$ is the associated second output pixel value, and $E_p^2$ is an expected detection value of said corresponding first input pixel.

9. The method as recited in claim 1 wherein the second input test image shift in phase to the first input test phase in step (f) is about 90 degrees.

10. The method as recited in claim 1 wherein step (k) comprises the step of erasing the stored first and second input test images from the hologram storage medium.

11. The method as recited in claim 1 wherein step (k) comprises the step of erasing the stored second input test image from the hologram storage medium.

12. A hologram-write method for mitigating detection scatter noise in holographic storage systems by determining orientations of scatter noise vectors before writing hologram data into a holographic storage medium, the method comprising the steps of:

a) inputting first input test data into an input device having M pixels, each input device pixel containing a first test data value corresponding to a first input test data expected detection value;

b) outputting a first object beam, containing the first input test data, from the input device;

c) interfering a write reference beam with the object beam to write the first input test data into the holographic storage medium as a set of first gratings, each of the first gratings corresponding to a pixel in the input device;

d) illuminating the holographic storage medium with a read reference beam propagating along the centerline of the write reference beam to produce a first output test image, the first output test image being derived from the first input test data and a random scatter noise within the holographic storage medium;

e) recording the first output test image on a detector array having at least M pixels, each detector array pixel corresponding to the input device pixel and containing a first recorded value, the first recorded value deviating form the corresponding first input test data expected detection values due to the scatter noise originating from the holographic storage medium;

f) inputting second input test data into the input device;

g) outputting a second object beam, containing the second input test data, from the input device;

h) combining the second object beam with a second write reference beam collinear with the first reference beam but shifted in phase by 90 degrees with respect to the first write reference beam in the holographic storage medium, as a set of second grating, to record a second output test image;

i) illuminating the holographic storage medium with the read reference beam propagating along the centerline of the write reference beam to produce the second output test image, the second output test image being derived from the second input test data and the random scatter noise within the holographic storage medium;

j) recording the second output test image on the detector array as a set of second recorded values;

k) computing an orientation of a scatter noise vector in the holographic storage medium, form the first and the second recorded values;

l) inputting final hologram data modulated by the orientation of the scatter noise vector into the input device;

m) outputting a final object beam, containing the final hologram data, from the input device; and n) interfering a write reference beam with the final object beam to write the final hologram data into the holographic storage medium as a set of final gratings, thereby resulting in reducing detection scatter noise at a subsequent hologram readout.

13. The method as recited on claim 12 wherein the first and second input test data are written with first and second strength levels, respectively, and the final hologram data are written with a final strength level, the first and second strength levels determining intensity levels of the first and second output images, respectively, the first and second strength levels being much lower than the final strength level.

14. The method as recited in claim 12 wherein step (h) comprises the step of storing each of the second gratings at a distance from a corresponding first grating, the distance being a quarter of an optical wavelength along the direction of a propagation vector of the corresponding first grating.

15. The method as recited in claim 14 wherein the first and second input test data are identical.

16. The method as recited in claim 15 wherein the first input test data comprise an array of first input pixels, the first output test image comprises an array of first output pixels, the second output test image comprises an array of second output pixels, and wherein the orientation of a scatter noise vector at a first grating in the holographic storage medium is computed according to the following formula:

$$\tan(\phi) = \frac{V_2 - V_1 - E_p^2}{V_1 - E_p^2}$$

where $\phi$ is a phase shift datum associated with the scatter noise vector and with a first input pixel corresponding to said first grating, $V_1$ is the associated first output pixel value, $V_2$ is the associated second output pixel value, and $E_p^2$ is an expected detection value of said corresponding first input pixel.

17. The method as recited in claim 12 wherein step (h) comprises the steps of:

(1) storing each of the second gratings at a distance from a corresponding first grating, the distance being a quarter of an optical wavelength along the direction of a propagation vector of the corresponding first grating; and (2) erasing the first gratings from the holographic storage medium.

18. The method as recited in claim 17 wherein the first and second input test data are identical.

19. The method as recited in claim 18 wherein the first input test data comprise an array of first input pixels, the first output test image comprises an array of first output pixels, the second output test image comprises an array of second output pixels, and wherein the orientation of a scatter noise vector at a first grating in the holographic storage medium is computed according to the following formula:

$$\tan(\phi) = \frac{V_2 - E_p^2}{V_1 - E_p^2}$$

where $\phi$ is a phase shift datum associated with the scatter noise vector and with a first input pixel corresponding to said first grating, $V_1$ is the associated first output pixel value, $V_2$ is the associated second output pixel value, and $E_p^2$ is an expected detection value of said corresponding first input pixel.

20. The method as recited in claim 12 wherein step (n) comprises the step of erasing the sets of first and second gratings from the hologram storage medium.

21. The method as recited in claim 12 wherein step (n) comprises the step of erasing the set of second gratings from the hologram storage medium.

* * * * *